United States Patent [19]
Neumann-Henneberg

[11] Patent Number: 6,094,811
[45] Date of Patent: Aug. 1, 2000

[54] CENTRAL ELECTRIC SYSTEM FOR A MOTOR VEHICLE AND METHOD OF MANUFACTURING SAME

[76] Inventor: Wolf Neumann-Henneberg, Dürbheimerstr. 41, D-78604 Rietheim-Weilheim, Germany

[21] Appl. No.: 09/048,627

[22] Filed: Mar. 26, 1998

[30] Foreign Application Priority Data

Mar. 27, 1997 [DE] Germany .............. 197 13 008

[51] Int. Cl.[7] .................................................. H01H 9/00
[52] U.S. Cl. .............................. 29/842; 29/825; 29/840; 29/846
[58] Field of Search ............................. 29/825, 830, 842, 29/855, 846

[56] References Cited

U.S. PATENT DOCUMENTS

| | | | |
|---|---|---|---|
| 4,795,861 | 1/1989 | O'Rourke | 29/846 X |
| 4,899,439 | 2/1990 | Potter et al. | 29/846 |
| 4,920,639 | 5/1990 | Yee | 29/846 |
| 5,829,127 | 11/1998 | Hagner | 29/846 |

FOREIGN PATENT DOCUMENTS

| | | |
|---|---|---|
| 0271163 | 6/1988 | European Pat. Off. . |
| 0500219 | 8/1992 | European Pat. Off. . |
| 0590644 | 4/1994 | European Pat. Off. . |
| 0653278 | 5/1995 | European Pat. Off. . |
| 2836166 | 11/1979 | Germany . |
| 3608752 | 5/1987 | Germany . |
| 4101368 | 7/1992 | Germany . |

*Primary Examiner*—Carl J. Arbes
*Attorney, Agent, or Firm*—Bachman & LaPointe, P.C.

[57] ABSTRACT

The invention relates to a central electric system for a motor vehicle, having at least two pressed screens arranged parallel to one another with a distance between them, said pressed screens having web conductors formed by punching. For simple manufacture of the central electric system, the disclosure proposes that each pressed screens be extrusion coated with a holding frame of plastic; then the web conductors that are connected to one another at separation points are separated from one another; terminal contacts are bent at a right angle so they project away; the holding frames are assembled, and bent sections of web conductors of a pressed screen, cropped as web conductor connectors, are electrically connected to web conductors of another pressed screen e.g., by ultrasonic welding. The disclosure makes it possible to manufacture central electric systems with complex wiring and cabling with a few pressed screens by a simple method.

6 Claims, 3 Drawing Sheets

CENTRAL ELECTRIC SYSTEM FOR A MOTOR VEHICLE AND METHOD OF MANUFACTURING SAME

BACKGROUND OF THE INVENTION

The invention relates to a method of manufacturing a central electric system for a motor vehicle. The invention also relates to a central electric system for a motor vehicle.

A central interface of an automotive electric system is one such central electric system. It has sites for relays and fuses and connection options for cable harnesses provided with electric coupling elements. For reasons of reliability and security, such a central electric system must be very sturdy to withstand the high stresses in vehicular operation.

Such a central electric system is known from German Patent DE 3,608,752 C1. The known central electric system has a plastic casing with a top part and a bottom part, where pressed screens made of an electrically conducting material, especially brass, are inserted in several parallel planes with a distance between them in both the top and bottom parts. These pressed screens are electrically insulated from one another by the distance. The known central electric system has the disadvantage that it is complicated to install the pressed screens into the top and bottom parts of the casing because of the number of pressed screens arranged one above the other. Another disadvantage is that there are limits to the complexity of the electric wiring and cabling, because additional connecting cables require additional pressed screens in additional levels, but these could not be introduced into the casing at an economically feasible cost. Furthermore, with each additional pressed screen, there is a greater risk of unwanted electric contact between adjacent pressed screens, e.g., due to loosening of a pressed screen from its fastening points in the casing or due to breakage of fastener elements of the casing, so that adequate reliability of the central electric system for the entire service life of the motor vehicle is no longer assured.

SUMMARY OF THE INVENTORY

The object of the invention is to create a central electric system for a motor vehicle which has a simple design even with complex wiring and cabling.

This object is achieved according to the invention. The central electric system according to this invention has two or more pressed screens with punched web conductors as electric connecting cables which are connected to one another at first at separation points. Each pressed screen is extrusion coated with a plastic holding frame, so that the web conductors are connected to one another through the holding frame. The holding frame has recesses at the separation points of the pressed screen, so that the separation points are exposed. After being extrusion-coated with the holding frame, the pressed screens are separated at their separation points into electrically insulated web conductors. This separation can be accomplished by a punching operation, for example, because the separation points are accessible for a punching tool through the recesses of the holding frame after the pressed screens have been extrusion-coated. The separation is preferably accomplished by ultrasound, i.e., by exciting the pressed screen to high-frequency mechanical vibration at the separation points, so the pressed screen is destroyed at the separation points, which are designed with a small cross section in relation to the web conductors. To improve the ultrasonic separation results, the separation points of the pressed screen are preferably designed with notches and especially by embossing notches on the top and bottom sides of the pressed screen and by notching in the plane of the pressed screen at the sides of the separation points through the design of the punching tool used for cutting the pressed screens.

Sections of the pressed screen to be bent, i.e., tongues of the web conductors which form terminal contacts or soldering pins, for example, are preferably bent after extrusion-coating the pressed screen with the holding frame. For this purpose, the holding frame has recesses through which the bending sites of the pressed screen are accessible to a bending tool and which offer the required clearance for bending. In addition, sections of web conductors as web conductor connectors are bent out of the plane of the pressed screen so that said sections come to rest on a web conductor of another pressed screen after assembling the holding frames. The holding frames are then assembled, where they are positioned one against the other in a known way, e.g., by means of pins of another holding frame engaging in complementary holes in a holding frame in the manner of a fit, and they are attached to one another by catch lugs, for example. After assembling the holding frames, the web conductor connectors are electrically connected to the web conductors provided for this purpose on another pressed screen. The connection can be created by soldering, or preferably by ultrasonic welding. This makes it possible in a simple way to electrically connect the web conductors from different planes. Due to the possibility of electrically connecting the web conductors of pressed screens in different planes, electrically insulated web conductors can be intersected almost at will, which thus permits complex wiring and cabling with a small number of pressed screens. In many cases, just two pressed screens are sufficient. Other advantages of the central electric system according to this invention include its sturdiness, because the electrically conducting web conductors are secured at many points by the electrically insulating holding frame. Due to this fact, unintentional electric connections, i.e., short circuits, are permanently prevented even with the high mechanical loads occurring in a motor vehicle due to vibration and impact. The central electric system according to this invention thus has a high reliability. Furthermore, there is the reduced number of pressed screens required for electric wiring and cabling plus the simplified construction due to easy assembly of the pressed screens extrusion coated with the holding frames.

In a further development of the invention, one or more pressed screens have soldering pins that are bent to stand out in one direction and are soldered in a flow solder bath to printed conductors of a laminated circuitboard. In this way, the web conductors of the pressed screen are connected to completely assembled circuitboards, i.e., to electronic circuits, so that the central electric system according to this invention has electronic functions.

To impart a mechanical hold to sections bent so that they stand away from one pressed screen in the direction of another pressed screen, i.e., in particular the terminal contacts and the soldering pins of the web conductors, the holding frame of the other pressed screen in embodiments of the invention has slotted passages through which extend the projecting sections of the web conductors of one pressed screen.

In a further development of the invention, the projecting sections as contact tongues may each be provided with a slit, and they preferably have catch lugs on both sides that reach behind the holding frame through which the contact tongue passes. In this way the web conductors of one pressed screen are locked to the holding frame of another pressed screen. If the contact tongue is spread apart, e.g., by inserting a fuse, a blade contact of a relay or a wire into its slot, the locking is additionally secured against unintentional loosening.

To improve the spreading performance of the slotted contacts, its slot is wider in the middle area than at the ends, which increases the mechanical load-bearing capacity of the locking of the contact tongue to the frame. The locking provides mechanical hold for the contact tongue in the direction perpendicular to the pressed screen, i.e., against tensile or compressive forces acting on the contact tongue.

In one embodiment of the invention, one or more web conductors has a contact tongue with a slot into which is inserted a wire that provides an electric connection between this contact tongue and an identical contact tongue on another web conductor of the same or a different pressed screen. This embodiment of the invention yields additional possible intersections of electrically insulated web conductors, so that even more complex wiring and cabling can be implemented with simple means.

In one embodiment of the invention, a screw connection, e.g., in the form of a threaded hole, is provided on one of more web conductors for attaching a cable lug.

BRIEF DESCRIPTION OF PREFERRED EMBODIMENTS

The invention is explained in greater detail below on the basis of one embodiment illustrated in the figures, which show:

FIG. 1: a perspective view of a central electric system for a motor vehicle according to the invention;

FIG. 2: a perspective view of the central electric system from FIG. 1, as seen from the opposite side;

FIG. 3: an enlarged detail according to arrow III in FIG. 1;

FIG. 4: a separation point between two web conductors of the central electric system according to this invention; and FIG. 5: an enlarged view of a contact tongue according to one embodiment of the invention.

DETAILED DESCRIPTION OF PREFERRED EMBODIMENTS

Figure 1:
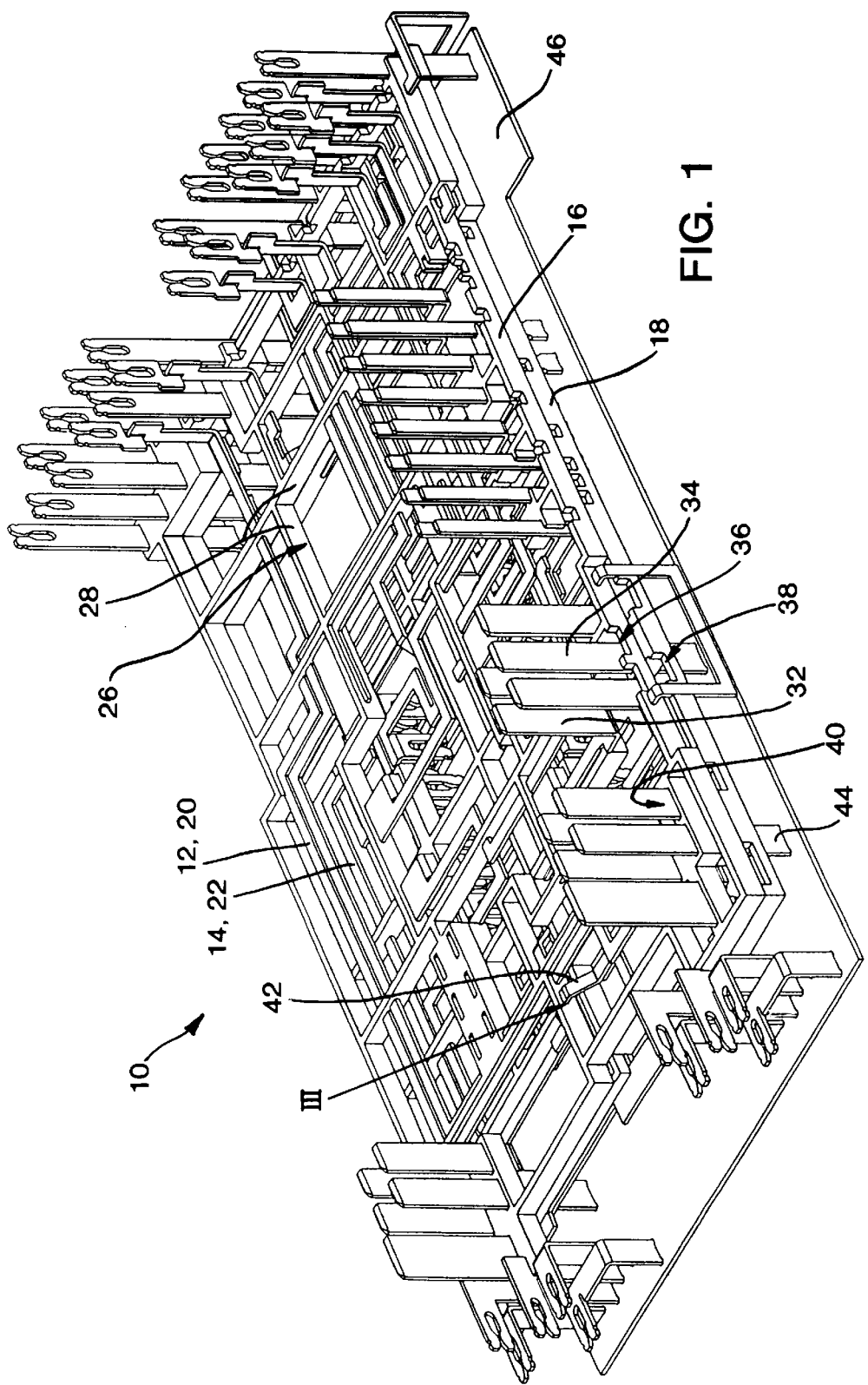
Figure 2:
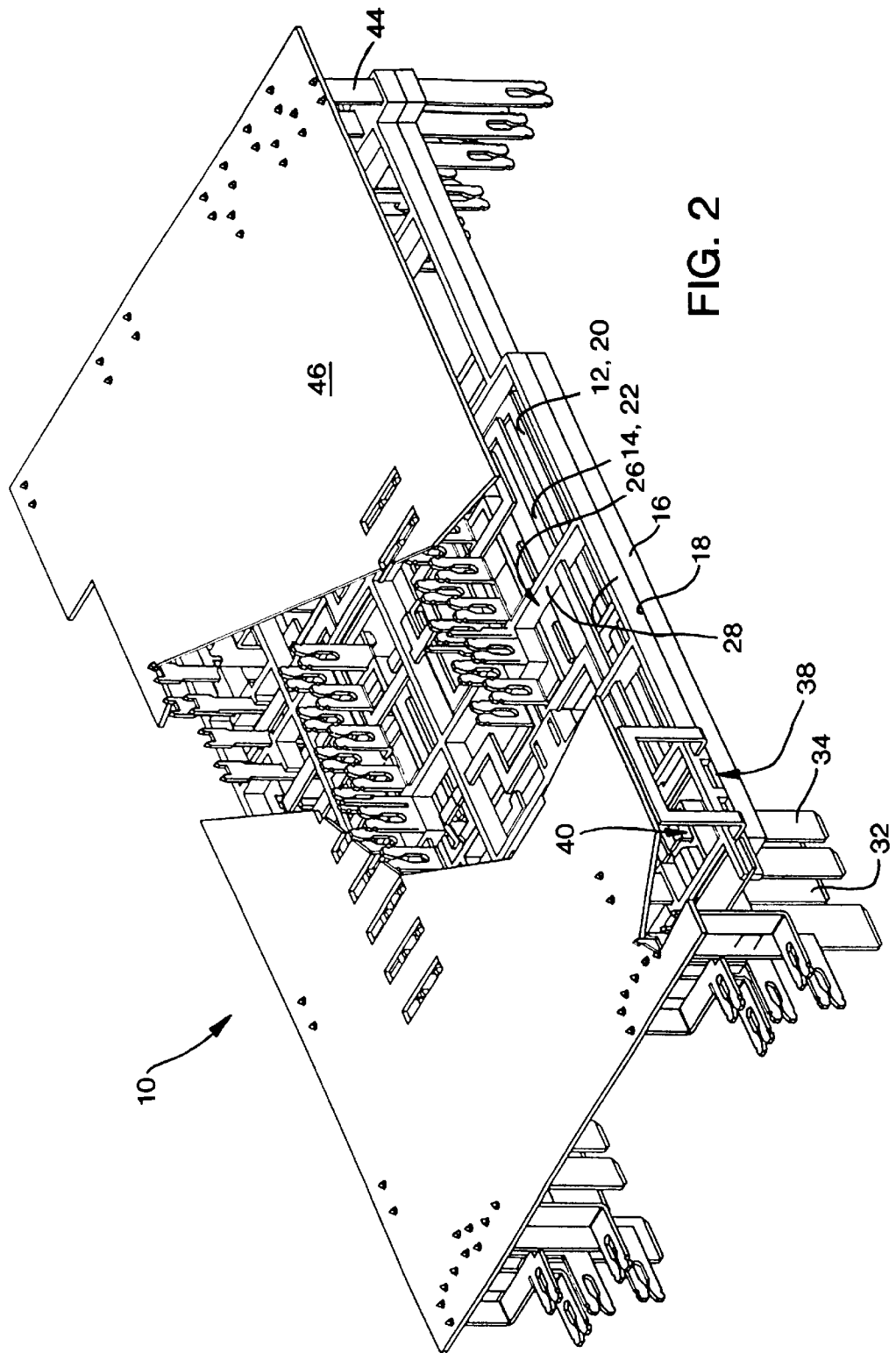

The central electric system according to this invention as shown in FIGS. 1 and 2 has two pressed screens 12, 14 which are arranged with a distance between them in two parallel planes. Each of the pressed screens 12, 14 is extrusion coated with its own plastic holding frame 16, 18, all of which are essentially identical.

Figure 4:
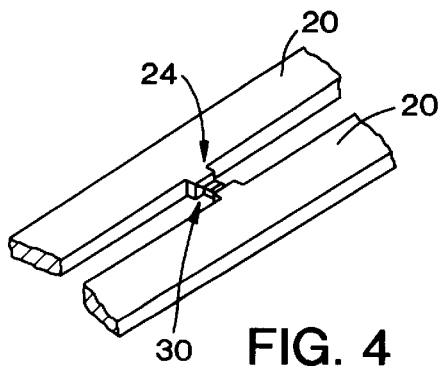

The pressed screens 12, 14 are cut from a flat sheet of brass, thus forming web conductors 20, 22 which are mechanically connected at separation points 24 (FIG. 4) until extrusion coated with the holding frames 16, 18, to secure the web conductors 20, 22 of a pressed screen 12, 14 against one another until they are extrusion coated. After extrusion coating of the pressed screen 12, 14, the holding frame 16, 18 holds web conductors 20, 22 of the pressed screen 12, 14 against one another, so that they can be separated at the separation points 24 to insulate them electrically from one another.

To be able to separate the pressed screen 12, 14 at the separation points 24, the separation points 24 are freely accessible to a separation tool. For this purpose, the holding frame 16, 18 has recesses in the area of the separation points 24, thus exposing the separation points 24. In the embodiment shown here, the recesses of interspaces 26 are formed between webs 28 of holding frame 16, 18. The separation points 24 are not visible in FIGS. 1 and 2 because they have already been removed.

Separation can be accomplished by punching, for example. In the embodiment shown here, the separation points have been destroyed with ultrasound, i.e., by exciting pressed screen 12, 14 in the area of separation points 24 to highfrequency mechanical vibrations. To improve the ultrasonic separation results, separation points 24 have a notch 30 on all sides, i.e., separation points 24 are notched from the top and bottom by embossing and from both sides by punching.

If bending of sections of web conductors 20, 22 which form perpendicularly projecting terminal contacts 32, 34 or soldering pins 44, for example, is intended, this can be done before extrusion coating. Preferably, however, these sections 32, 34 are bent after holding frame 16, 18 is extrusion coated around pressed screen 12, 14. Thus, pressed screen 12, 14 is extrusion coated while still flat and unbent. To permit bending, the holding frame has recesses 36, 38 into which the sections 32, 34, 44 to be bent are inserted after extrusion coating and which guarantee the required clearance for bending the sections 32, 34, 44.

The holding frames 16, 18, which are designed essentially, are assembled after extrusion coating of pressed screen 12, 14 with holding frame 16, 18, separating pressed screens 12, 14 into electrically insulated web conductors 20, 22 and bending of terminal contacts 32, 34 and soldering pins 44. For positioning, the holding frames 16, 18 have essentially known pins (not shown in the drawings) which engage in complementary holes of the other holding frame 18, 16 in the manner of a fit. Holding frames 16, 18 are attached to one another by means of known catch lugs (not shown) which engage when holding frames 16, 18 are pressed together. To provide an additional mechanical hold for the terminal contacts 32, 34, soldering pins 44 and other projecting bent sections, if any, of web conductors 22 of a pressed screen 14 which project through the holding frame 16 of the other pressed screen 12, the holding frame 16 through which the sections project has slotted passages 40 through which the terminal contacts 32, 34 and soldering pins 44 project.

Figure 3:
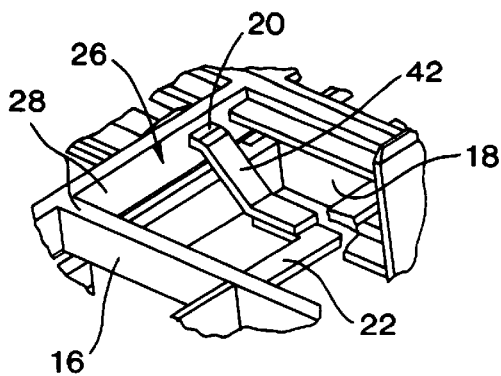

For electrical connection of two web conductors 20, 22 of different pressed screens 12, 14, at least one of these web conductors 20 has a bent section (cropped in the embodiment shown) which is bent as web conductor connector 42 so that, after assembling the holding frame 16, 18, it is in contact with the web conductor 22 of the other pressed screen 14 to which it is to be electrically connected (FIG. 3). The bending of web conductor connector 42 can be done like the bending of terminal contacts 32, 34 and soldering pins 44 before or after extrusion coating of pressed screen 12, 14 with holding frame 16, 18. For this purpose, holding frames 16, 18 in the area of web conductor connector 42 also have recesses in the form of interspaces 26 between webs 28 of holding frame 16 through which the web conductor connector 42 is freely accessible for a bending tool. The web conductors 20, 22 are connected to one another by ultrasonic welding.

The pressed screens 12, 14 of the central electric system 10 according to this invention as shown in the figures have soldering pins 44, which are bent like terminal contacts 32, 34 so that they project at a right angle away from one side of the central electric system 10. They are soldered in a soldering bath to printed conductors of a laminated circuitboard 46 in a known way. This yields additional possibilities of electrical connection of web conductors 20, 22 of one or more different pressed screens 12, 14 to one another. Furthermore, there is the possibility of connecting the web conductors 20, 22 to electronic components assembled on circuitboard 46, so that central electric system 10 has electronic functions. The latter possibility is not utilized in the embodiment illustrated here. Since the printed conductors of the circuitboard 46 are covered with a protective layer, they are not visible in the drawing.

Figure 5:
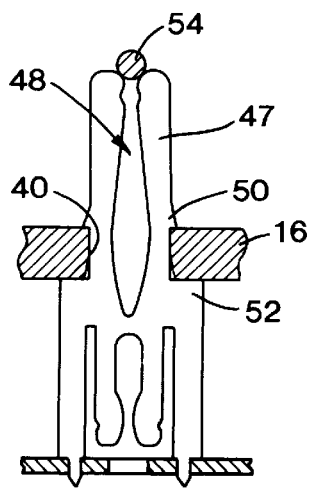

As shown in FIG. 5, terminal contacts 47 which project through a slotted passage 40 of a holding frame 16 have a slot 48 which is open at one side and catch lugs 50 at the sides. Catch lugs 50 extend over holding frame 16 and thus hold terminal contact 47. in holding frame 16. Catch lugs 50 work together with shoulders 52 which are in contact with the opposite side of the holding frame 16. The terminal contact 47 is thus secured on holding frame 16 against pulling and compression, such as that which occurs in pulling and pushing a mating contact (not shown). Slot 48 permits a lateral resiliency of catch lugs 50 in pushing the terminal contact 47 through the slotted [passage] 40 of the holding frame 16.

The widest part of slot 48 is at the level of catch lugs 50, and slot 48 becomes narrower toward its ends. Therefore, any spreading force is greatest in the area of catch lugs 50. By inserting a wire 54, which is shown in FIG. 5 at the mouth of slot 48, into slot 48, the terminal contact 47 is additionally spread apart and held in that position, thus ensuring the fixation of the terminal contact 47 with its catch lugs 50 on holding frame 16. The terminal contact 47 can be electrically connected to another identical terminal contact 47 by wire 54. This yields another simple possibility of electrically interconnecting the web conductors 20, 22 of one pressed screen 12, 14 in particular, but also those of different pressed screens 12, 14. Instead of spreading the contact with wire 54, terminal contact 47 can be spread by inserting a blade contact of a relay or a fuse element into slot 48 of the terminal contact 47 (not shown).

The central electric system 10 shown here is intended for insertion into a casing (not shown) which has slots for relays, fuses, coupling elements of individual wiring harnesses, etc., which provide a mechanical hold for these plug elements and project into the terminal contacts 32, 34 of central electric system 10.

What is claimed is:

1. A method of manufacturing a central electric system for a motor vehicle with web conductors arranged in at least two planes that are essentially parallel to one another, which comprises: providing two electrically conducting pressed screens; extrusion coating said two electrically conducting pressed screens independently of one another with a holding frame made of plastic; providing separation points in the pressed screens at which said pressed screens can be separated into electrically insulated web conductors; providing recesses in the holding frames at the separation points of the pressed screens and freely exposing the separation points at the recesses; separating the pressed screens, after being extrusion coated, into their web conductors at their separation points; bending sections of the web conductors so they project away from the pressed screens; assembling the holding frames which hold the web conductors; and electrically connecting at least two web conductors of two pressed screens to one another, including the step of providing that one web conductor has a bent section as a web conductor connector to the web conductor of the other pressed screen.

2. A method according to claim 1, wherein the bending step includes bending at least one terminal contact and soldering pins of the web conductors so that they project away from the pressed screens.

3. A method according to claim 1, wherein the pressed screens are bent after being extrusion coated.

4. A method according to claim 1, wherein the pressed screens are separated at the separation points by ultrasound.

5. A method according to claim 1, wherein the electric connection of web conductors of two pressed screens is accomplished by ultrasonic welding.

6. A method according to claim 2, wherein soldering pins are bent to project away from the web conductors of the pressed screens and are soldered to printed conductors of a laminated circuitboard.

* * * * *